(12) United States Patent
Ye et al.

(10) Patent No.: US 12,125,770 B2
(45) Date of Patent: Oct. 22, 2024

(54) IN-LINE POWER DEVICE, SEMICONDUCTOR ASSEMBLY, IN-WHEEL MOTOR DRIVER OR VEHICLE DRIVER AND NEW-ENERGY VEHICLE (71) Applicant: Shenzhenshi Pengyuan Electronics Co., Ltd., Guangdong (CN)

(72) Inventors: Chunxian Ye, Guangdong (CN); Xubiao Zhan, Guangdong (CN); Tao Li, Guangdong (CN); Shengchao Ruan, Guangdong (CN)

(73) Assignee: SHENZHENSHI PENGYUAN ELECTRONICS CO., LTD., Guangdong (CN)

( * ) Notice: Subject to any disclaimer, the term of this patent is extended or adjusted under 35 U.S.C. 154(b) by 626 days.

(21) Appl. No.: 17/287,504

(22) PCT Filed: Jul. 19, 2019

(86) PCT No.: PCT/CN2019/096825
§ 371 (c)(1),
(2) Date: Apr. 21, 2021

(87) PCT Pub. No.: WO2020/206867
PCT Pub. Date: Oct. 15, 2020

(65) Prior Publication Data
US 2022/0399252 A1 Dec. 15, 2022

(30) Foreign Application Priority Data

Apr. 8, 2019 (CN) .......................... 201910277415.6
Apr. 8, 2019 (CN) .......................... 201920465783.9

(51) Int. Cl.
H02M 7/00 (2006.01)
H01L 23/31 (2006.01)
(Continued)

(52) U.S. Cl.
CPC .......... *H01L 23/49* (2013.01); *H01L 23/3107* (2013.01); *H01L 23/49503* (2013.01); *H02K 11/33* (2016.01); *H02M 7/003* (2013.01)

(58) Field of Classification Search
CPC . H01L 23/49; H01L 23/495; H01L 23/49541; H01L 23/3107; H01L 23/3114; H02K 11/33; H02M 7/003
See application file for complete search history.

(56) References Cited

U.S. PATENT DOCUMENTS

2014/0008702 A1    1/2014  Hoeglauer et al.
2015/0270203 A1*   9/2015  Nishiuchi ......... H01L 23/49551
                                                    438/123
(Continued)

FOREIGN PATENT DOCUMENTS

CN    104934400 A    9/2015
CN    106257655 A   12/2016
(Continued)

OTHER PUBLICATIONS

China Patent Application No. 201910277415.6; Office Action; dated Sep. 28, 2023; 22 pages.

*Primary Examiner* — Hoa C Nguyen
(74) *Attorney, Agent, or Firm* — BakerHostetler (57) ABSTRACT An in-line power device, a semiconductor assembly, an in-wheel motor driver or a vehicle driver, and a new-energy vehicle are provided. The in-line power device includes: a body including a power chip and a wrapping layer wrapping an outer surface of the power chip; and a plurality of pins provided at a first side of the body at intervals. The plurality of pins includes a power pin, an auxiliary control pin and a control signal pin, and each pin includes a first segment provided inside the wrapping layer and a second segment provided outside the wrapping layer. The second segment of the auxiliary control pin and the second segment of the (Continued)

control signal pin are located in a first plane, the second segment of the power pin and the first side are located in a second plane, and the first plane is not parallel to the second plane.

7 Claims, 6 Drawing Sheets

(51) Int. Cl.
*H01L 23/49* (2006.01)
*H01L 23/495* (2006.01)
*H02K 11/33* (2016.01)

(56) References Cited

U.S. PATENT DOCUMENTS

2018/0012828 A1* 1/2018 Beer ................ H01L 23/49537
2019/0221504 A1* 7/2019 Nishiyama .......... H01L 23/4952

FOREIGN PATENT DOCUMENTS

| CN | 106298722 A | 1/2017 |
| CN | 108022918 A | 5/2018 |
| CN | 109428498 A | 3/2019 |
| CN | 110010577 A | 7/2019 |

* cited by examiner

IN-LINE POWER DEVICE, SEMICONDUCTOR ASSEMBLY, IN-WHEEL MOTOR DRIVER OR VEHICLE DRIVER AND NEW-ENERGY VEHICLE

CROSS-REFERENCE TO RELATED APPLICATION

This application is the National Stage Application of International Patent Application No. PCT/CN2019/096825, filed Jul. 19, 2019, which claims priority to and benefits of Chinese Patent Application Serial Numbers 201920465783.9 and 201910277415.6, both applications were filed with the China National Intellectual Property Administration on Apr. 8, 2019, and the entire contents of each are incorporated herein by reference.

FIELD

The present disclosure relates to the field of semiconductors, and more particularly to an in-line power device, a semiconductor assembly, an in-wheel motor driver or vehicle driver and a new-energy vehicle.

BACKGROUND

Discrete in-line power devices are the most widely used packaging types of power devices, due to the features of simple design, strong universality, good delivery time and highly cost effective and the like. However, due to the development of the power semiconductor device, as the voltage and current increase, the speed also increases, and the interference of the current change rate di/dt to the control signal according to the parasitic inductance of a pin in the common terminal of power and control signal (source/emitter) is increasingly serious.

Therefore, the technology related to the discrete in-line power devices still need to be improved and optimized.

SUMMARY

The present disclosure aims to solve at least one problem of the related arts to some extent.

In an aspect of the present disclosure, the present disclosure provides an in-line power device. According to embodiments of the present disclosure, the in-line power device includes: a body including a power chip and a wrapping layer wrapping an outer surface of the power chip; and a plurality of pins provided at a first side of the body at intervals, and including a power pin, an auxiliary control pin and a control signal pin. Each pin includes a first segment provided in the wrapping layer and electrically connected to the power chip and a second segment electrically connected to the first segment and provided outside the wrapping layer, and the second segment of the auxiliary control pin and the second segment of the control signal pin are located in a first plane, the second segment of the power pin and the first side are located in a second plane, the first plane is not parallel to the second plane, and a first angle between the first plane and a third plane where the body is located is greater than or equal to −180° and less than or equal to +180°, a second angle between the second plane and the third plane is greater than or equal to −180° and less than or equal to +180°.

In another aspect of the present disclosure, the present disclosure provides a semiconductor assembly. According to embodiments of the present disclosure, the semiconductor assembly includes: an in-line power device, a first connection component and a second connection component. The in-line power device includes: a body including a power chip and a wrapping layer wrapping an outer surface of the power chip; and a plurality of pins provided at a first side of the body at intervals, and including a power pin, an auxiliary control pin and a control signal pin. Each pin includes a first segment provided in the wrapping layer and electrically connected to the power chip and a second segment electrically connected to the first segment and provided outside the wrapping layer, and the second segment of the auxiliary control pin and the second segment of the control signal pin are located in a first plane, the second segment of the power pin and the first side are located in a second plane, the first plane is not parallel to the second plane, and a first angle between the first plane and a third plane where the body is located is greater than or equal to −180° and less than or equal to +180°, a second angle between the second plane and the third plane is greater than or equal to −180° and less than or equal to +180°. The first connection component is electrically connected to the second segment of the auxiliary control pin and the second segment of the control signal pin in the in-line power device. The second connection component is electrically connected to the power pin in the in-line power device.

In yet another aspect of the present disclosure, the present disclosure provides an in-wheel motor driver or a vehicle driver. According to the embodiments of the present disclosure, the in-wheel motor driver or the vehicle driver includes an semiconductor assembly, an inner stator, and an outer rotor, the semiconductor assembly is provided between the inner stator and the outer rotor. The semiconductor assembly includes: an in-line power device, a first connection component and a second connection component. The in-line power device includes: a body including a power chip and a wrapping layer wrapping an outer surface of the power chip; and a plurality of pins provided at a first side of the body at intervals, and including a power pin, an auxiliary control pin and a control signal pin. Each pin includes a first segment provided in the wrapping layer and electrically connected to the power chip and a second segment electrically connected to the first segment and provided outside the wrapping layer, and the second segment of the auxiliary control pin and the second segment of the control signal pin are located in a first plane, the second segment of the power pin and the first side are located in a second plane, the first plane is not parallel to the second plane, and a first angle between the first plane and a third plane where the body is located is greater than or equal to −180° and less than or equal to +180°, a second angle between the second plane and the third plane is greater than or equal to −180° and less than or equal to +180°. The first connection component is electrically connected to the second segment of the auxiliary control pin and the second segment of the control signal pin in the in-line power device. The second connection component is electrically connected to the power pin in the in-line power device.

DETAILED DESCRIPTION

Embodiments of the present disclosure will be described in detail below. The embodiments described herein are exemplary, and used to explain the present disclosure. The embodiments shall not be construed to limit the present disclosure. If the specific technology or conditions are not indicated in the embodiments, and then they can be carried out in accordance with the technology or conditions as described in the literature or product specification in this field. The reagents or instruments used are conventional products available on the market if the manufacturer is not indicated.

In an aspect of the present disclosure, an in-line power device is provided in the present disclosure. According to embodiments of the present disclosure, referring to FIG. 1, the in-line power device includes a body 10 that includes a power chip and a wrapping layer wrapping an outer surface of the power chip; and a plurality of pins 20 provided at a first side 11 of the body at intervals and including a power pin 21, an auxiliary control pin 22 and a control signal pin 23. Each pin 20 includes a first segment (not shown) provided in the wrapping layer and electrically connected to the power chip, and a second segment electrically connected to the first segment and provided outside the wrapping layer. The second segment 222 of the auxiliary control pin and the second segment 232 of the control signal pin are located in a first plane, a second segment 212 of the power pin and the first side 11 are located in a second plane, and the first plane is not parallel to the second plane. A first angle between the first plane and a third plane where the body is located is greater than or equal to −180° and less than or equal to +180°, and a second angle between the second plane and the third plane is greater than or equal to −180° and less than or equal to +180°. By arranging the power pin, the auxiliary control pin and the control signal pin on two non-parallel planes, the in-line power device can greatly reduce or even completely avoid the mutual crosstalk of the power current and the control signal, improve the layout of the connection component of the main power terminal, reduce the parasitic inductance, greatly increase the power density of the system, reduce the system oscillation, and optimize the consistency in parallel, etc., and it is particularly suitable for applications of reduced volume, high power and high requirement, such as a new energy vehicle driver, particularly an in-wheel motor driver, and the power grid, locomotive, photovoltaic, wind power, high power density power supply and other fields.

According to the embodiments of the present disclosure, the angle between the first plane and the second plane is not particularly limited and may be flexibly set to any angle as long as the first plane is not parallel to the second plane. Specifically, in the present disclosure, when viewed from a left side of the power device (i.e. in a left side view) and based on the third plane where the body is located (i.e. a plane where a surface of the body including the first side and having the largest area is located), if the second segment of the pin is deflected in the counterclockwise direction, then the angle between a plane where the second segment of the pin is located and the third plane is positive; if the second segment of the pin is deflected in the clockwise direction, then the angle between the plane where the second segment of the pin is located and the third plane is negative. The first angle between the first plane and the third plane and the second angle between the second plane and the third plane can be arbitrarily selected between −180° and +180°, as long as they are not equal.

In some specific embodiments, in consideration of simple processing, better security of the device or other factors, the first angle between the first plane and the third plane where the body is located is greater than or equal to −90° and less than or equal to +90°, and the second angle between the second plane and the third plane is greater than or equal to −90° and less than or equal to +90°. Therefore, within this angle range, it is easy to process, and the second segment of the pin has a small bending angle and is not easy to crack or break.

Figure 1:
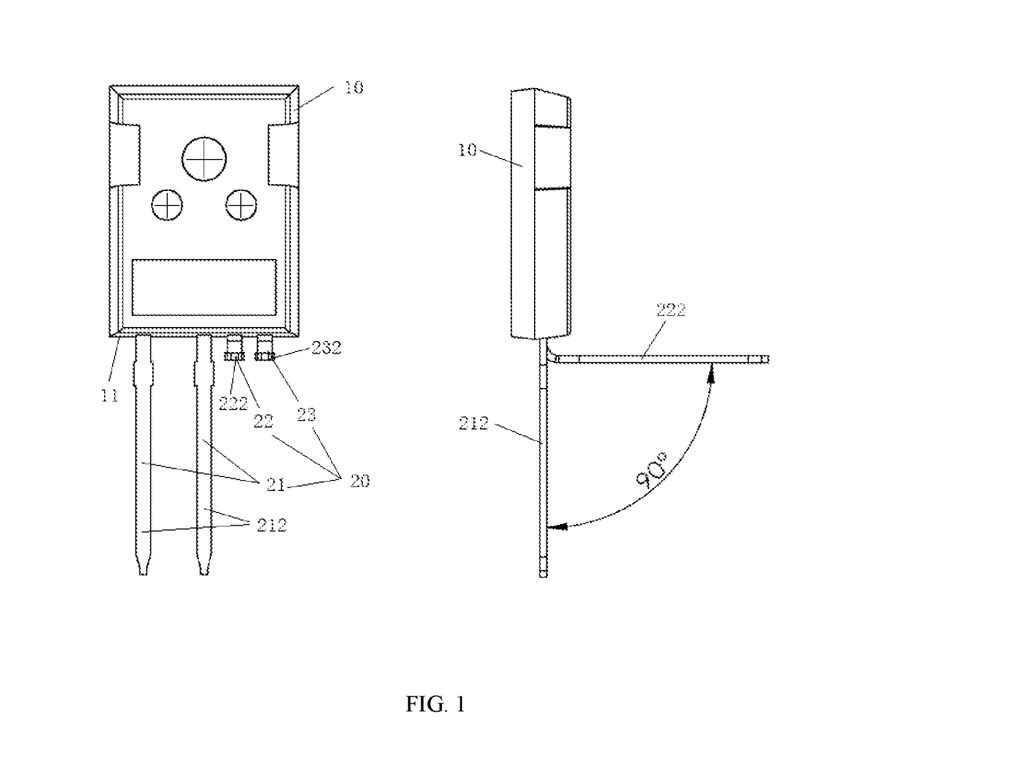
FIG. 1 is a schematic view of an in-line power device of an embodiment of the present disclosure.

According to the embodiments of the present disclosure, one of the first plane and the second plane can be parallel to the third plane where the body is located. FIG. 1 (in which, the left part is a front view, the right part is a left view) illustrates a situation where the second plane where the power pin is located is parallel to the third plane where the body is located. Therefore, the power pin or the auxiliary control pin and the control signal pin only need to be bent, the processing steps can be simplified, the yields can be improved, and the costs can be reduced.

According to the embodiments of the present disclosure, the angle between the first plane and the second plane may be 90°, that is, the first plane is perpendicular to the second plane. Therefore, a power connection component and a control signal connection component connected with the pins may be vertically distributed. Furthermore, the distribution of the connection components can be optimized, the three-dimensional space can be used better, the volume of the device can be reduced, and the power density of the device can be improved.

Figure 2:
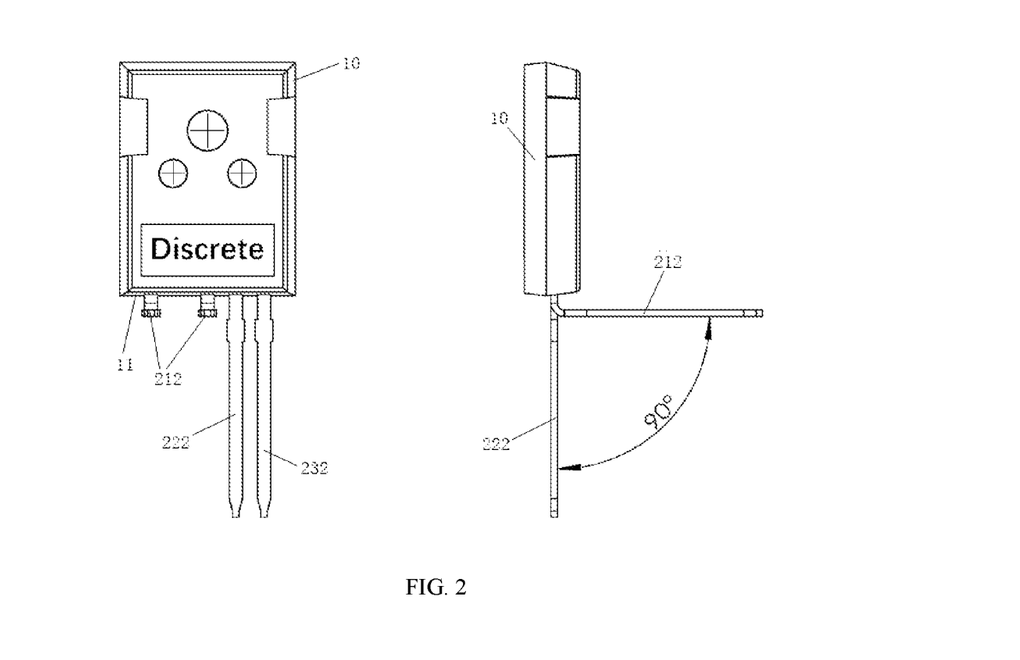
FIG. 2 is a schematic view of an in-line power device of another embodiment of the present disclosure.

In some specific embodiments, when one of the first plane and the second plane is parallel to the third plane where the body is located, an angle between the other of the first plane and the second plane and the third plane can be 90°. Specifically, referring to FIG. 1, the situation where the second plane is parallel to the third plane and the first angle between the first plane and the third plane is +90° is illustrated; referring to FIG. 2 (in which, the left part is a front view, the right part is a left view), the situation where the first plane is parallel to the third plane and the second angle between the second plane and the third plane is +90° is illustrated.

Figure 3:
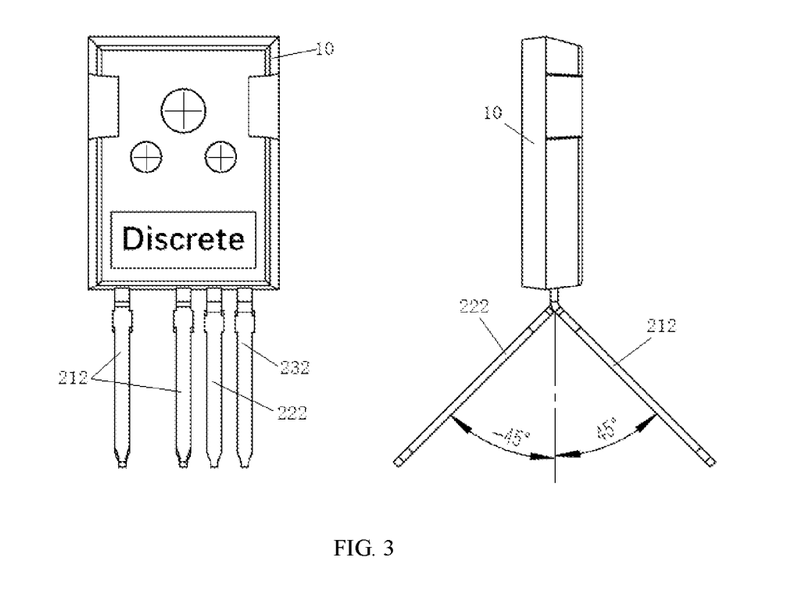
FIG. 3 is a schematic view of an in-line power device of another embodiment of the present disclosure.
Figure 4:
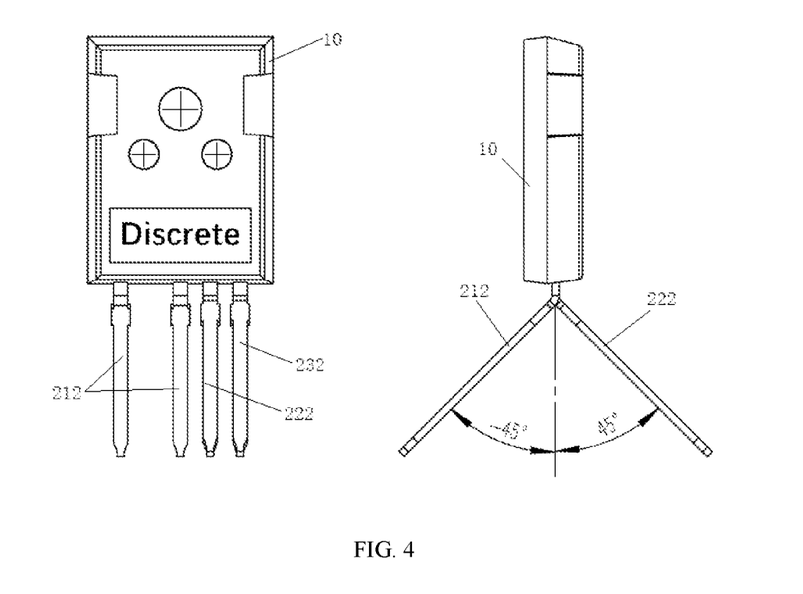
FIG. 4 is a schematic view of an in-line power device of another embodiment of the present disclosure.

In other specific embodiments, an angle between one of the first plane and the second plane and the third plane is +45°, and an angle between the other of the first plane and the second plane and the third plane is −45°. Specifically, referring to FIG. 3 (in which, the left part is a front view, the right part is a left view), the situation where the first angle between the first plane and the third plane is +45° and the second angle between the second plane and the third plane is −45° is illustrated; referring to FIG. 4 (in which, the left part is a front view, the right part is a left view), the situation where the second angle between the second plane and the third plane is +45° and the first angle between the first plane and the third plane is −45° is illustrated.

Figure 5:
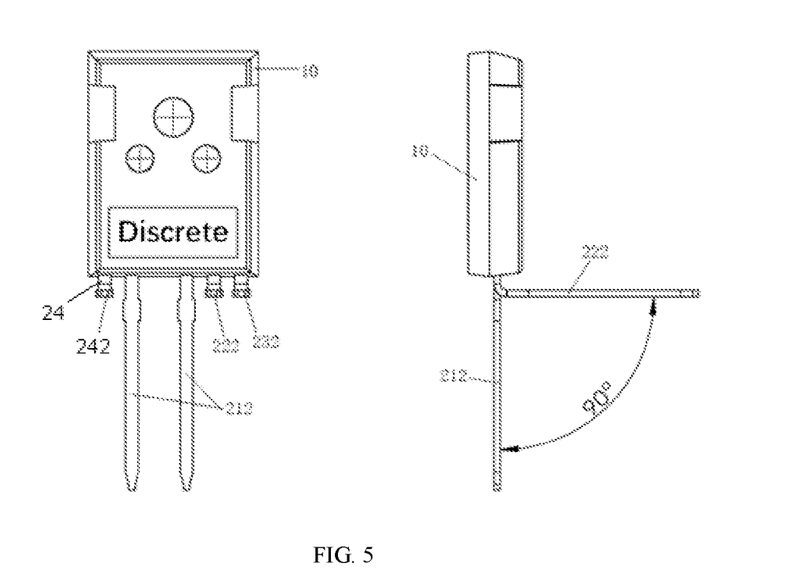
FIG. 5 is a schematic view of an in-line power device of another embodiment of the present disclosure.

According to the embodiments of the present disclosure, the specific number of the above power pins, auxiliary control pins and control signal pins is not particularly limited, which can be arbitrarily selected according to the type, the specific use requirement or the like of the power chip. In some specific embodiments, the commonly utilized power chips such as transistors are composed of three terminals, so the power device can include two power pins, one auxiliary control pin and one control signal pin (referring to FIGS. 1 to 4); in other specific embodiments, a voltage drop can be detected by introducing an auxiliary pin to cooperate with a gate driver for short-circuit protection function and other uses. Specifically, referring to FIG. 5 (in which, the left part is a front view, the right part is a left view), the pins 20 also include an auxiliary pin 24, and a second segment 242 of the auxiliary pin is located in the first plane. Of course, those having ordinary skills in the art can understand that the number of the auxiliary pins can be one or two, three, four or more according to the actual requirements.

According to the embodiments of the present disclosure, a specific packaging method of the above body is not particularly limited, and can be any packaging methods known in the art, for example, which for example include but are not limited to TO-220, TO-247, TO-264, TO-247 Plus, ISOPLUS247, TO-264 Plus and ISOPLUS i4-PAC, etc., thereby leading to a wide range of use.

According to the embodiments of the present disclosure, a manner of making the first plane and the second plane not parallel is not particularly limited. In some specific embodiments, the pin can be bent to a suitable angle before performing the packaging of the body, then the body is encapsulated, and the first plane and the second plane have a predetermined angle after encapsulating; in other embodiments, the second segment of the pin can be bent to a suitable angle after completing the packaging of the body. Thus, the operation is simple and convenient, and easy to be realized.

According to the embodiments of the present disclosure, a specific type of the power chip in the body is not limited, and can be any power chips in the art, which for example include but are not limited to the transistor. According to some specific embodiments of the present disclosure, the transistor can include at least one of an insulated gate bipolar transistor (IGBT), a metal-oxide-semiconductor field effect transistor (MOSFET), a junction field effect transistor (JFET), a diode, a thyristor and a high electron mobility transistor. Those skilled in the art can understand that the power chip can be a silicon carbide material chip, a silicon material chip, a gallium nitride material chip, a gallium oxide material chip, a diamond material chip, an aluminium nitride material chip and the like, which thus has a wide range of applicability and can be applied to various fields.

Figure 6:
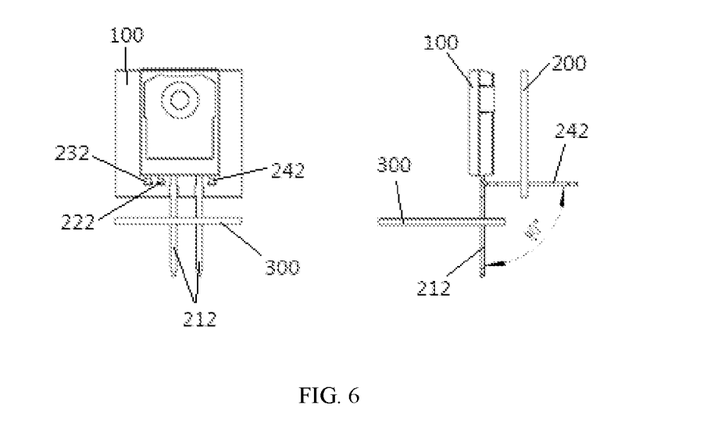
FIG. 6 is a schematic view of a semiconductor assembly of an embodiment of the present disclosure.

In another aspect of the present disclosure, a semiconductor assembly is provided in the preset disclosure. According to embodiments of the present disclosure, referring to FIG. 6 (in which, the left part is a front view, the right part is a left view), the semiconductor assembly includes: the aforementioned in-line power device 100; a first connection component 200 electrically connected to the second segment 222 of the auxiliary control pin and the second segment 232 of the control signal pin in the in-line power device 100; and a second connection component 300 electrically connected to the second segment 212 of the power pin in the in-line power device 100. A power current and a control signal in the semiconductor assembly are spatially separated, such that the connection components connected to the power pin and the control signal pin are also not in the same plane respectively, the crosstalk problem between the power current and the control signal can be reduced greatly or even avoided completely, the safety of the assembly can be improved, at the same time the distribution of the connection components can be more optimized, the volume of the assembly can be reduced, and the power density of the assembly can be improved.

According to the embodiments of the present disclosure, the semiconductor assembly also includes a radiator having at least one of a circular shape, a polygonal shape, an elongated shape, and at least one in-line power device is provided on at least one surface of the radiator. Therefore, the in-line power device can be integrated to save the volume of the assembly and improve the power density of the assembly.

According to the embodiments of the present disclosure, the specific type of the semiconductor assembly is not particularly limited and can be any semiconductor assembly. In some specific embodiments of the present disclosure, the semiconductor assembly includes at least one of an inverter, a power converter, a power supply and a rectifier. Therefore, the crosstalk problem of the assembly can be reduced obviously, the layout of the connection components in the assembly can be more optimized at the same time, the volume of the assembly can be reduced, and the power density of the assembly can be improved.

Figure 7:
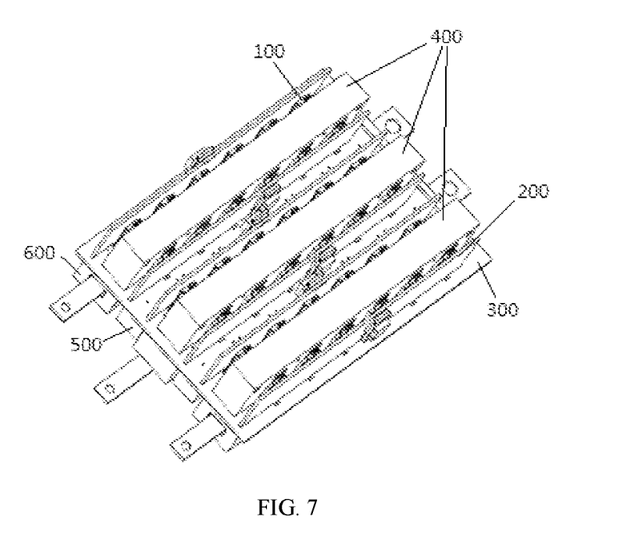
FIG. 7 is a schematic view of a semiconductor assembly of another embodiment of the present disclosure.

In some specific embodiments, referring to FIG. 7, which illustrates a schematic view of a three-phase bridge inverter composed of six power devices connected in parallel and arranged side by side, a second angle between the second plane and the third plane is 0°, and a first angle between the first plane and the third plane is +90°. Specifically, referring to FIG. 7, the inverter includes a radiator 400, an in-line power device 100, a first connection component (specifically a printed circuit board) 200, a second connection component (specifically a printed circuit board) 300, a power support capacitor 500 and a current sensor 600. Two opposite surfaces of the radiator 400 are provided with a plurality of in-line power devices 100, the first connection component (specifically the printed circuit board) 200 is electrically connected to the second segment 242 of the auxiliary pin, the second segment 222 of the auxiliary control pin and the second segment 232 of the control signal pin in the in-line power device 100, the second connection component 300 is electrically connected to the second segment 212 of the power pin in the in-line power device 100, and the power support capacitor 500 and the current sensor 600 are electrically connected to the second connection component 300. Therefore, the second connection component and the first connection component can form a mutually perpendicular layout, which takes full advantage of the three-dimensional space, reduces the requirement of the connection component layout and the crosstalk of the system, and promotes the reliability of the system.

Figure 8:
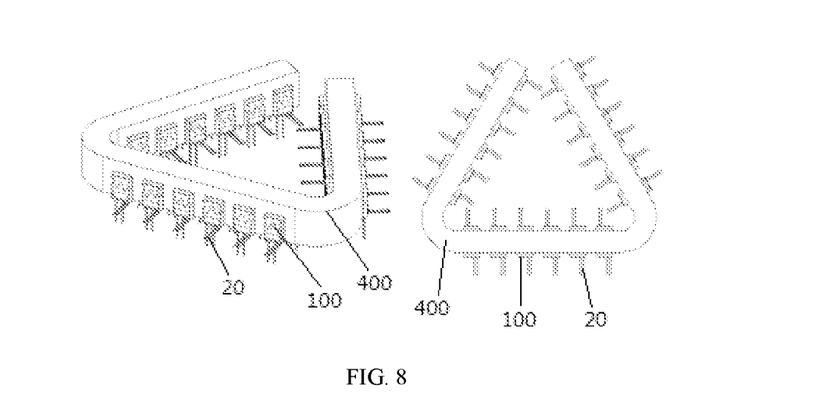
FIG. 8 is a schematic view of a semiconductor assembly of another embodiment of the present disclosure.
Figure 9:
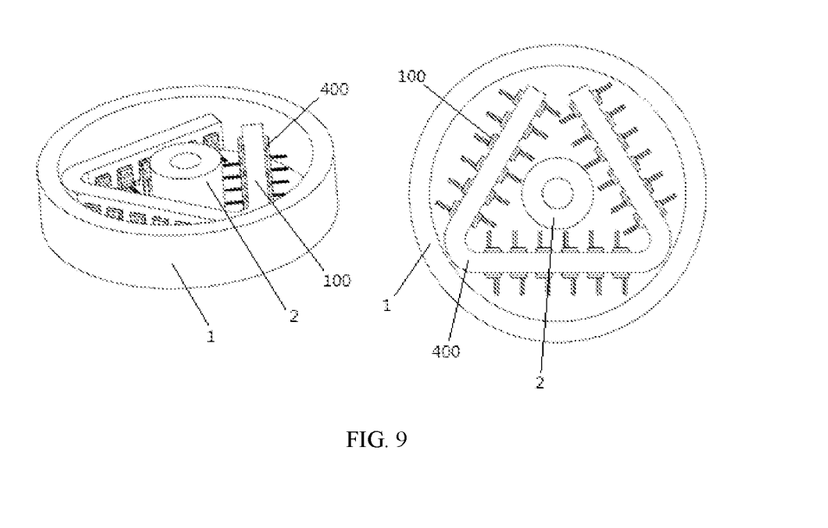
FIG. 9 is a schematic view of an in-wheel motor of an embodiment of the present disclosure.

In other specific embodiments, referring to FIG. 8, which illustrates a schematic view of a three-phase bridge inverter composed of six power devices connected in parallel and arranged in a triangle, a second angle between the second plane and the third plane is 0°, and a first angle between the first plane and the third plane is +90. Specifically, referring to FIG. 8, the inverter includes a radiator 400 and an in-line power device 100. Opposite surfaces of the radiator 400 are provided with a plurality of in-line power devices 100 connected in parallel. A water channel path of a water-cooled radiator can be shortened by setting the radiator in a triangle, and the effect of heat dissipation can be further improved. Moreover, if a motor is driven, such as an in-wheel motor, such an installation manner can be fitted into the in-wheel motor (referring to FIG. 9). Specifically, the inverter can be provided between an outer rotor 1 of the in-wheel motor and an inner stator 2 of the in-wheel motor to achieve drive and motor integration, greatly reducing the transmission loss and interference, and improving the real-time performance of a motor drive.

Figure 10:
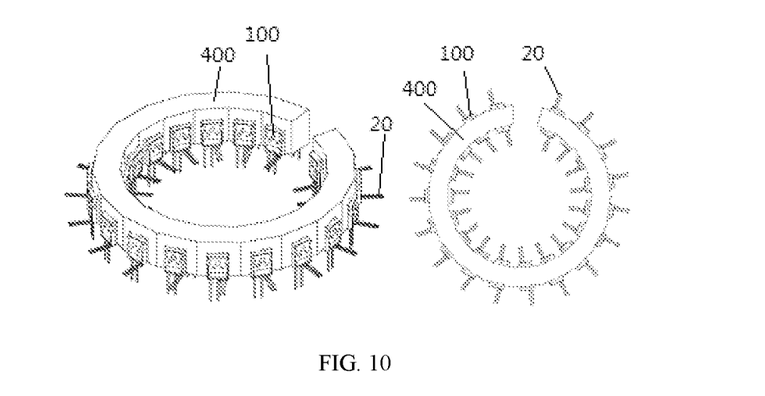
FIG. 10 is a schematic view of a semiconductor assembly of another embodiment of the present disclosure.
Figure 11:
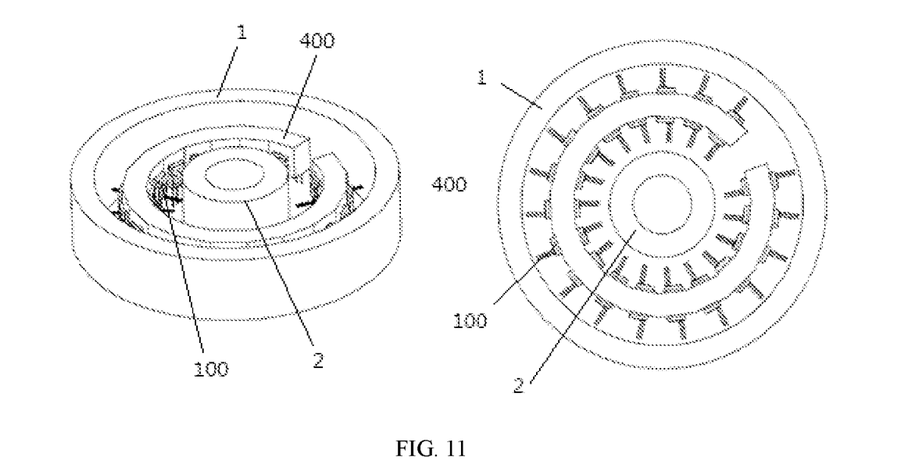
FIG. 11 is a schematic view of an in-wheel motor of another embodiment of the present disclosure.

In other specific embodiments, referring to FIG. 10, which illustrates a schematic view of a three-phase bridge inverter composed of six power devices connected in parallel and arranged in a polygon or a circle, a second angle between the second plane and the third plane is 0, and a first angle between the first plane and the third plane is +90°. Specifically, referring to FIG. 10, the inverter includes a radiator 400 and an in-line power device 100. A plurality of surfaces of the radiator 400 are provided with a plurality of in-line power devices 100 connected in parallel. A water channel path of a water-cooled radiator can be shortened by arranging the radiator in a circle or a polygon, and the effect of heat dissipation can be further improved. Moreover, if a motor is driven, such as an in-wheel motor, such installation manner can be fitted into the in-wheel motor (referring to FIG. 11). Specifically, the inverter can be provided between the outer rotor 1 of the in-wheel motor and the inner stator 2 of the in-wheel motor to achieve drive and motor integration, greatly reducing the transmission loss and interference, and improving the real-time performance of motor drive.

In yet another aspect of the present disclosure, an in-wheel motor driver or a vehicle driver is provided in the present disclosure. According to the embodiments of the present disclosure, the in-wheel motor driver or the vehicle driver includes the aforementioned in-line power device or the aforementioned semiconductor assembly. The in-wheel motor driver or the vehicle driver has all the features and the advantages of the aforementioned in-line power device, which are not elaborated here.

In still another aspect of the present disclosure, a new-energy vehicle is provided in the present disclosure. According to the embodiments of the present disclosure, the new-energy vehicle includes the aforementioned in-line power device or the aforementioned semiconductor assembly or the aforementioned in-wheel motor driver or vehicle driver. The new-energy vehicle has all the features and the advantages of aforementioned in-line power device, which are not elaborated here.

Of course, those skilled in the art can understand that the aforementioned in-wheel motor driver, the vehicle driver or the new-energy vehicle also includes, in addition to the aforementioned structures, necessary structures and components of a conventional in-wheel motor driver, vehicle driver or new-energy vehicle. Taking the new-energy vehicle as an example, the new-energy vehicle also includes a vehicle body, a window, a tire, an engine, a seat, interior decoration, and other necessary structures and components of the conventional vehicle, which are not elaborated here.

Hereinafter, the embodiments of the present disclosure are described in detail.

Embodiment 1

The in-line power device is prepared according to the TO-247-4L, then the auxiliary control pin and the control signal pin are bent such that the first angle between the first plane where the auxiliary control pin and the control signal pin are located and the third plane where the body of the power device is located is +90°, and an angle between a second plane where the power pin and a first side of the body are located and the third plane where the body is located is 0°, thus obtaining the in-line power device. The power chip is a silicon carbide MOSFET.

Comparative Example 1

Figure 12:
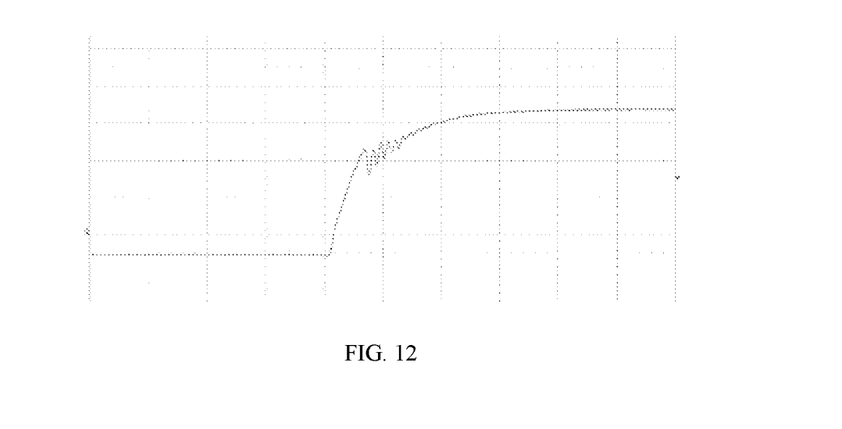
FIG. 12 is a gate waveform graph of an in-line power device in embodiment 1 of the present disclosure.
Figure 13:
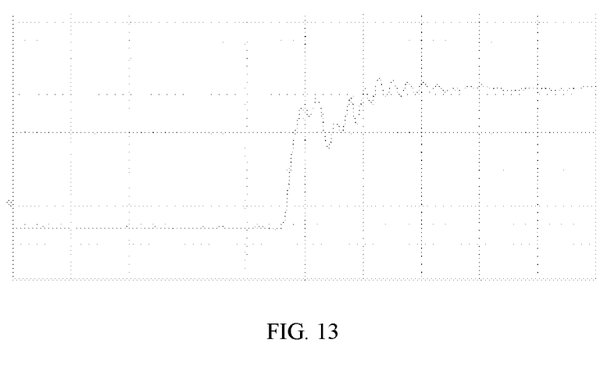
FIG. 13 is a gate waveform graph of an in-line power device in comparative example 1 of the present disclosure.

It is the same as the embodiment 1, the difference is that the angle between the first plane where the auxiliary control pin and the control signal pin are located and the third plane where the body is located is 0°.
Performance Test:

The in-line power devices obtained from the embodiment 1 and the comparative example 1 are tested and compared in the double pulse test platform, and the test conditions are bus voltage 800 VDC, current 30 A. A gate waveform graph of the in-line power device obtained from the embodiment 1 is illustrated in FIG. 12, and a gate waveform graph of the in-line power device obtained from the comparative example 1 is illustrated in FIG. 13. It can be seen from FIGS. 12 and 13, the gate wave oscillation and crosstalk of the in-line power device obtained from the embodiment 1 are greatly improved when the silicon carbide MOSFET is turned on under the conditions of bus voltage 800 VDC, current 30 A.

In the description of the present disclosure, terms "first," "second," should be constructed for purposes of illustration only and should not be constructed to indicate or imply relative importance or indicate or imply the number of technical features. Therefore, defining the features of "first," "second," that may explicitly or implicitly include one or more of the features. In the descriptions of the present disclosure, the term "a plurality of" means two or more than two unless specified or limited otherwise.

Reference throughout this specification to "an embodiment," "some embodiments," "an example," "a specific example," or "some examples," means that a particular feature, structure, material, or characteristic described in connection with the embodiment or example is included in at least one embodiment or example of the present disclosure. Thus, the appearances of the phrases in various places throughout this specification are not necessarily referring to the same embodiment or example of the present disclosure. Furthermore, the particular features, structures, materials, or characteristics may be combined in any suitable manner in one or more embodiments or examples. In addition, those skilled in the related art may combine and incorporate different embodiments or examples and their features described in the specification, without mutual contradictions.

Although explanatory embodiments have been illustrated and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. An in-line power device, comprising:
a body comprising a power chip and a wrapping layer wrapping an outer surface of the power chip; and
a plurality of pins provided at a first side of the body at intervals, and comprising two power pins, one auxiliary control pin and one control signal pin, wherein each pin comprises a first segment provided in the wrapping layer and electrically connected to the power chip, and a second segment electrically connected to the first segment and provided outside the wrapping layer; the second segment of the one auxiliary control pin and the second segment of the one control signal pin are located in a first plane, the second segment of the power pins and the first side are located in a second plane, the first plane is not parallel to the second plane; and a first angle between the first plane and a third plane where a surface of the body including the first side and having the largest area is located is greater than or equal to −180° and less than or equal to +180°, and a second angle between the second plane and the third plane is greater than or equal to −180° and less than or equal to +180°, wherein the second plane is parallel to the third plane, and an angle between the first plane and the third plane is +90°; and wherein the plurality of pins also comprises an auxiliary pin configured to detect a voltage drop and cooperate with a gate driver for a short-circuit protection function, and the second segment of the auxiliary pin is located in the first plane.

2. The in-line power device according to claim 1, wherein the first angle is greater than or equal to −90° and less than or equal to +90°, and the second angle is greater than or equal to −90° and less than or equal to +90°.

3. The in-line power device according to claim 1, wherein an angle between the first plane and the second plane is +90°.

4. The in-line power device according to claim 3, wherein an angle between one of the first plane and the second plane and the third plane is +45°, and an angle between the other of the first plane and the second plane and the third plane is −45°.

5. The in-line power device according to claim 1, wherein the power chip comprises a transistor.

6. The in-line power device according to claim 5, wherein the transistor comprises at least one of an insulated gate bipolar transistor, a metal-oxide-semiconductor field effect transistor, a junction field effect transistor, a diode, a thyristor and a high electron mobility transistor.

7. The in-line power device according to claim 1, wherein the power chip is a silicon carbide material chip, a silicon material chip, a gallium nitride material chip, a gallium oxide material chip, a diamond material chip, or an aluminum nitride material chip.

* * * * *